US010997016B2

(12) United States Patent
Chen et al.

(10) Patent No.: US 10,997,016 B2
(45) Date of Patent: *May 4, 2021

(54) METHOD OF ENCODING DATA

(71) Applicant: INTEL CORPORATION, Santa Clara, CA (US)

(72) Inventors: Huimin Chen, Portland, OR (US);
Andrew Martwick, Portland, OR (US);
Howard Heck, Hillsboro, OR (US);
Robert Dunstan, Forest Grove, OR (US);
Dennis Bell, Beaverton, OR (US);
Abdul Ismail, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/506,066

(22) Filed: Jul. 9, 2019

(65) Prior Publication Data
US 2020/0026599 A1 Jan. 23, 2020

Related U.S. Application Data

(63) Continuation of application No. 13/942,315, filed on Jul. 15, 2013, now Pat. No. 10,372,527.

(51) Int. Cl.
H03M 5/06 (2006.01)
G06F 11/10 (2006.01)
H03M 5/12 (2006.01)

(52) U.S. Cl.
CPC ............. *G06F 11/10* (2013.01); *H03M 5/06* (2013.01); *H03M 5/12* (2013.01)

(58) Field of Classification Search
CPC ... H04W 52/22; H04W 52/58; H04W 72/042; H04W 72/1205; H04L 5/0048; H04L 27/2602; H04L 1/0046; H04L 1/0072; H04L 1/0079; H04L 1/0091; H04L 1/004; H04L 5/0053; H04L 5/003; H04L 1/0061; H04L 1/0083; H04L 1/0067; G06F 11/10; H03M 5/06; H03M 5/12
USPC .................................................. 714/807, 701
See application file for complete search history.

(56) References Cited

U.S. PATENT DOCUMENTS

| 5,438,573 | A | 8/1995 | Mangan et al. |
| 6,167,550 | A | 12/2000 | Gray |
| 6,795,451 | B1 | 9/2004 | Giorgetta et al. |
| 6,975,611 | B1 | 12/2005 | Balachandran et al. |
| 7,035,337 | B2 | 4/2006 | Sugiyama et al. |
| 7,197,050 | B2 | 3/2007 | Lucidarme |
| 7,299,402 | B2 * | 11/2007 | Soong .................. H04L 1/0002 370/522 |
| 8,423,856 | B2 * | 4/2013 | Cai ....................... H04L 1/1896 370/329 |

(Continued)

*Primary Examiner* — Albert Decady
*Assistant Examiner* — Enam Ahmed
(74) *Attorney, Agent, or Firm* — Schwabe, Wiliamson & Wyatt, P.C.

(57) ABSTRACT

Techniques for encoding data are described herein. The method includes receiving a block payload at a physical layer to be transmitted via a data bus. The method includes establishing a block header comprising an arrangement of bits, the block header defining two block header types, wherein a hamming distance between block header types is at least four.

21 Claims, 5 Drawing Sheets

(56) References Cited

U.S. PATENT DOCUMENTS

| | | |
|---|---|---|
| 2002/0095629 A1* | 7/2002 | Umeda .............. H04N 1/32144 |
| | | 714/701 |
| 2006/0256875 A1 | 11/2006 | McClellan |
| 2008/0109707 A1 | 5/2008 | Dell et al. |
| 2009/0014218 A1 | 1/2009 | Fuchs et al. |
| 2009/0022137 A1 | 1/2009 | Aghili et al. |
| 2011/0013690 A1 | 1/2011 | Kobayashi et al. |
| 2011/0081872 A1 | 4/2011 | Bar-Sade et al. |
| 2011/0083066 A1* | 4/2011 | Chung .................. H03M 13/09 |
| | | 714/807 |
| 2012/0144275 A1* | 6/2012 | Odaka ................... H04L 1/0079 |
| | | 714/800 |
| 2013/0346823 A1 | 12/2013 | Cideciyan et al. |
| 2015/0019921 A1 | 1/2015 | Chen et al. |
| 2016/0140011 A1* | 5/2016 | Yeung .................... G06F 13/10 |
| | | 710/10 |
| 2016/0182084 A1 | 6/2016 | Yang et al. |

* cited by examiner

100

400

METHOD OF ENCODING DATA

CROSS REFERENCE TO RELATED APPLICATION

The present application is a Continuation Application of U.S. patent application Ser. No. 13/942,315, by Chen, et al., entitled "METHOD OF ENCODING DATA," filed Jul. 15, 2013, and which is incorporated herein by reference.

TECHNICAL FIELD

This disclosure relates generally to techniques for encoding data to be transmitted over a data bus. More specifically, the disclosure describes block headers in a line code.

BACKGROUND

A line code is a coding scheme to transform a data stream into a format suitable for transportation on a physical media. A transmitter transmits a line code with a source data encoded, and a receiver at a far-end recovers the source data based on line code decoding. A host device may connect to a peripheral device via an interface implementing a line coding scheme. Interfaces implementing line coding scheme may include various interfaces such as universal serial bus (USB), peripheral component interconnect express (PCIe), DisplayPort, and the like. One example of line code is 8b/10b, which transforms an 8 bit data into a 10 bit line code. The 10 bit line code may subsequently be transmitted on a physical media. A far-end receiver may deterministically recover the original 8 bit data through 8b/10b line code decoding. Another example of line code is 64b/66b, which is constructed by prefixing a 2 bit block header into the original 64 bit data to form a 66 bit line code. This 66 bit line code may subsequently be transmitted on a physical media. By decoding the 2 bit block header, a far-end receiver may recover the original 64 bit data from the 66 bit line code.

DETAILED DESCRIPTION

Figure 1:
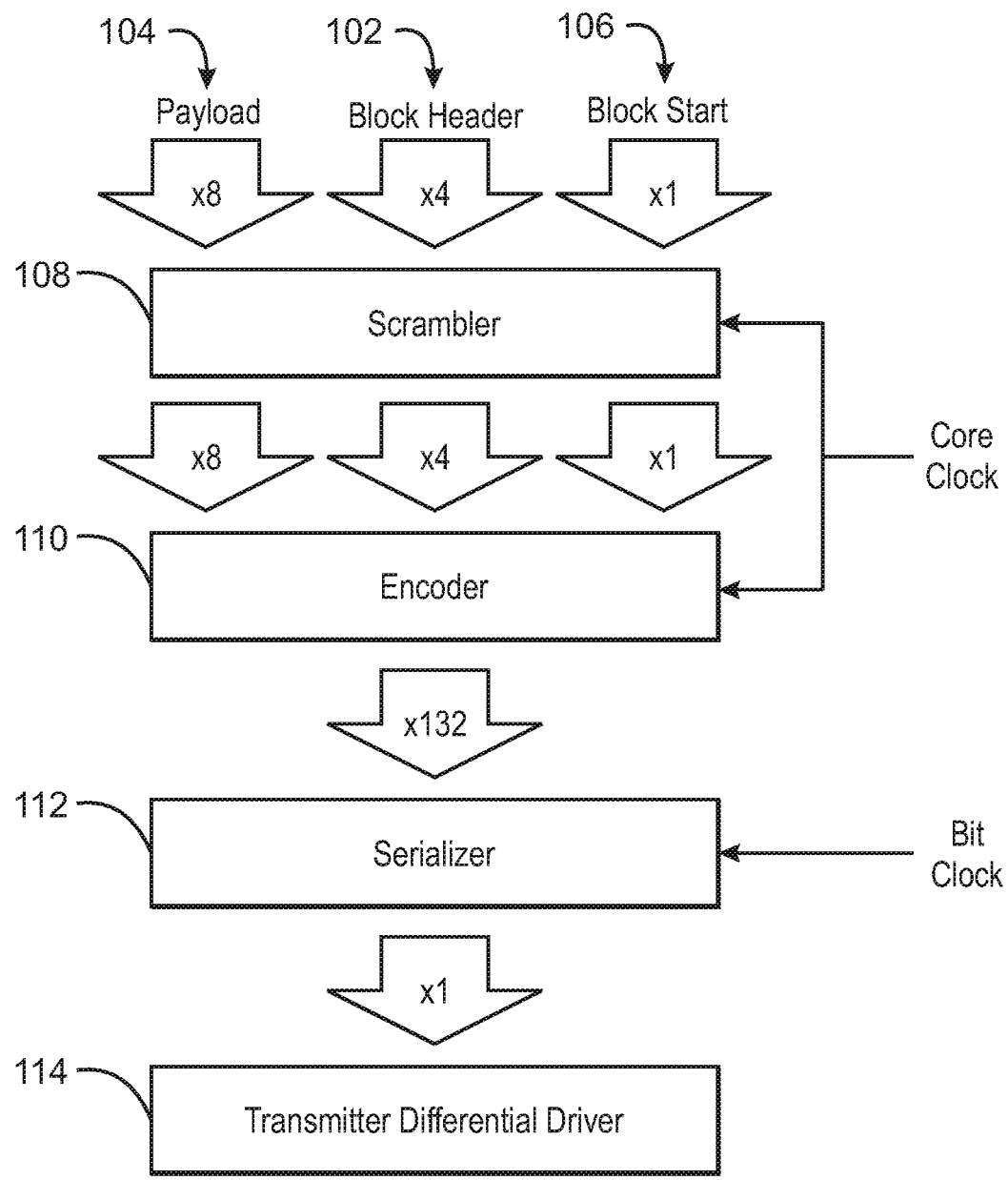
FIG. 1 is a block diagram used to illustrate line code encoding at a transmission side of a physical layer.

The subject matter disclosed herein relates to techniques for providing a header in line code. The header is a prefix indicating that a block payload will follow the header. The header defines the data stream of the block payload into a block format such that the transmitted block payload may be recovered. In general, two header types are defined within the block header including a data block header type and a control block header type. A data block header may indicate a data block payload. A control block header may indicate a control message payload. The type of header may be determined at a receiving component. In some cases, the header may contain errors. The subject matter disclosed herein comprises an arrangement of the header based on hamming distance such that a single-bit error may be detected and corrected, and a double-bit error may be detected. The hamming distance of this header arrangement is defined as the number of differences between the two header types at each corresponding bit position. A hamming distance between an arrangement for a data block header and an arrangement for a control block header is at least four. The hamming distance of at least four may enable error detection and correction as discussed in more detail below.

As used herein, the term "header" refers to a prefix or preamble of bits to be transmitted, or that have been transmitted, wherein the header at least partially defines the bits that follow the header in the transmission. In embodiments, the header described above may be a 4 bit header in a 128 bit/132 bit (128b/132b) line coding scheme. While the description that follows indicates 128b/132b as an example line coding scheme, other coding schemes may be used so long as the header includes a hamming distance of at least four between the header block types.

Further, the techniques for providing a header having a hamming distance of at least four between header block types may be implemented in an input/output (I/O) protocol such as Universal Serial Bus (USB), peripheral component interconnect express (PCIe), DisplayPort, and the like. The techniques described herein may also be implemented in any suitable future I/O protocol, including a unified I/O protocol.

As discussed above, in embodiments a line code is a 128b/132b line code. A 128b/132b line code us defined with a 4 bit block header and a 128-bit block payload. A transmitter configured to transmit 128b/132b line code may choose which types of 132 bit blocks to transmit depending on the information to be transmitted. For example, if a transmitter has a control message to transmit, it transmits a control block with a control block header. If the transmitter has data to transmit, it transmits a data block with a data block header. A receiver, upon receiving a block, may decode the block header. Based on the block header type, the receiver determines if the received block payload is a control message or data. As discussed above, the block headers of 128b/132b line code may be configured such that a hamming distance of four may be achieved between a control block header and a data block header. The hamming distance of 128b/132b line code enables double-bit error detection and single-bit error detection and correction within a block header.

FIG. 1 is a block diagram used to illustrate line coding at a transmission side of a physical layer. The block diagram 100 illustrates functions of the physical layer of a computing device configured to transmit data with a 4-bit header, such as in 128b/132b format, wherein a 4-bit header is followed by a 128-bit block payload. The physical layer may receive a data stream including a header, as indicated by the arrow 102, payload, as indicated by the arrow 104, and a block start, as indicated by the arrow 106. The header 102 is a 4-bit header while the payload comprises a series of sixteen 8-bit symbols. Further, the block start 106 may be a single bit configured to bypass a scrambler 108. The scrambler 108 is configured to scramble the payload to be transmitted. For example, the scrambler 108 may scramble the payload such that a relatively even distribution of 1's and 0's are found in the transmitted data. The relatively even distribution provided by the scrambler enables for greater DC balance while providing for sufficient transition in the transmitted payload.

The block header 102, the payload 104, and the block start 106 may be provided to an encoder 110. The encoder 110 is to format the data using a line code scheme. In embodiments, the encoder 110 encodes the data into the 128b/132b format wherein the payload is 128 bits and the header is 4 bits, such that the transmitted line data is 132 bits including the header. As discussed above, the 4-bit header may be one of two block types: a control block header or a data block header. In embodiments, when the 4-bit header is a data block header the arrangement of the 4-bit header of the header is "0011," and when the 4-bit header is a control block header the arrangement of the 4-bit header is "1100." Further, the 4-bit header, due to a hamming distance of 4 between the data block header and the control block header, enables for detection and correction of single bit errors in the header as well as double bit error detection in the header, as discussed in more detail below in reference to FIG. 2 and FIG. 3.

In embodiments, the header may be formatted to achieve DC balance and proper transition density. Alternative criteria may apply in terms relatively higher transition density or relatively lower transition density.

As illustrated in FIG. 1, the scrambler 108 and the encoder 110 may each receive a core clock input configured to enable synchronization of the scrambling and encoding performed by the respective components. The encoded data may be provided to a serializer 112 configured to convert the transmitted payload from a parallel format to a serial format for transmission via a transmitter differential driver 114. The encoder 110 may be implemented by any suitable hardware or combination of hardware and programming code. For example, the encoder 110 may be implemented in digital logic circuits, processors, or some combination thereof. In some embodiments, one or more components of the encoder 110 may be implemented as a general purpose processor, such as an ASIC or FPGA, executing programming code. Accordingly, a computing device operable to carry out the techniques described herein may include a processor and a tangible, non-transitory storage medium for storing programming code configured to implement the techniques disclosed herein.

Figure 2:
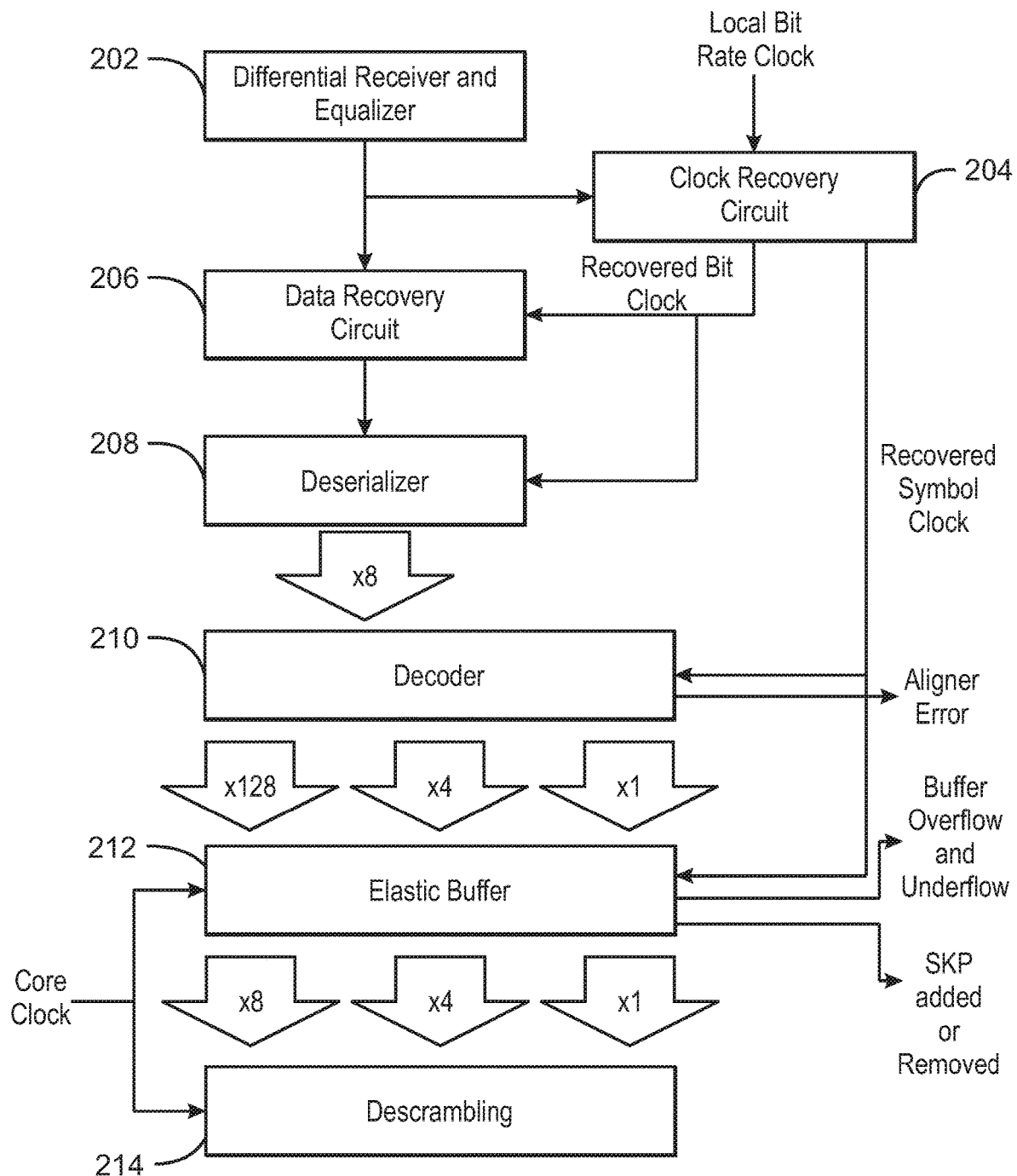
FIG. 2 is a block diagram illustrating line code decoding at a physical layer including a receiver.

FIG. 2 is a block diagram illustrating line code decoding at a physical layer including a receiver. The receiver 202 may be a differential receiver with equalization configured to receive the transmitted line code. A locally generated bit rate clock may be used in a clock recovery circuit 204 to recover a bit rate clock embedded in the received data stream at 202. The recovered bit rate clock may be provided to a data recovery circuit 206 and a deserializer 208. A recovered symbol clock may be derived from the recovered bit rate clock to operate a decoder 210. The deserializer 208 may convert the incoming data stream from a serial format to a parallel format and provide 8-bit bytes to the decoder 210. In some embodiments, the decoder 210 may be a 128b/132b decoder. The decoder 210 may be configured to work in concert with deserializer 208 for block header alignment and recovery. The recovered symbol clock may enable the decoder 210 to perform the block header alignment, block header recovery including error detection and correction.

In embodiments, the decoder 210 may encounter bit errors in the block header during the transmission. As illustrated in Table 1 below, the 4-bit header of the incoming line code may have a total of 16 different arrangements. If the data block header is set to 0011, for example, a single-bit error, such as 0001 (second column, first row), 0010 (third column, first row), 0111 (third column, second row), or 1011 (fourth column, second row), may be encountered as a single bit error with respect to the data block header of 0011 (fourth column and first row). Similarly, if the control block header is set to 1100, a single bit error, such as 1101 (second column, fourth row), 0100 (first column, third row), 1110 (third column, forth row), or 1000 (fourth column, third row), may be encountered as single-bit errors within respect to the control block header of 1100 (first column, fourth row). Double bit errors of 0000 (first column, first row), 0101 (first column, second row), 1001 (second column, second row), 1010 (third column, third row), 0110 (fourth column, third row), or 1111 (fourth column, fourth row), may be also encountered.

| 0000 | 0001 | 0010 | 0011 |
| 0101 | 1001 | 0111 | 1011 |
| 0100 | 1000 | 1010 | 0110 |
| 1100 | 1101 | 1110 | 1111 |

The arrangements of the data block header (0011 in the Table above) and the control block header (1100) enable the decoder to detect the single-bit errors and correct the single-bit errors. Further, the arrangements illustrated in Table 1 further indicate that double-bit errors may be detected. Thus, given a hamming distance between header types of at least 4, single-bit errors may be detected by the decoder 210 and may be corrected without requiring re-transmission of the entire block. Error correction performed by the decoder 210 is discussed in more detail below in reference to FIG. 3. Further, it is noted that single-bit and double bit errors may be detected and reported to a link layer associated with the physical layer 200 illustrated in FIG. 2.

The decoder 210 may recover the 4 bit header and the 128 bit payload and provide them to an elastic buffer 212. The elastic buffer 212 may operate in two clock domains, one from the recovered symbol clock writing the received data in, and one from the locally generated core clock reading the received data out. The block payload may then be provided to a descrambler 214. As illustrated in FIG. 2, both the descrambler and the elastic buffer 212 receive the reference clock signal, and the descrambler 214 may be configured to descramble the block payload based in part on the reference clock.

Figure 3:
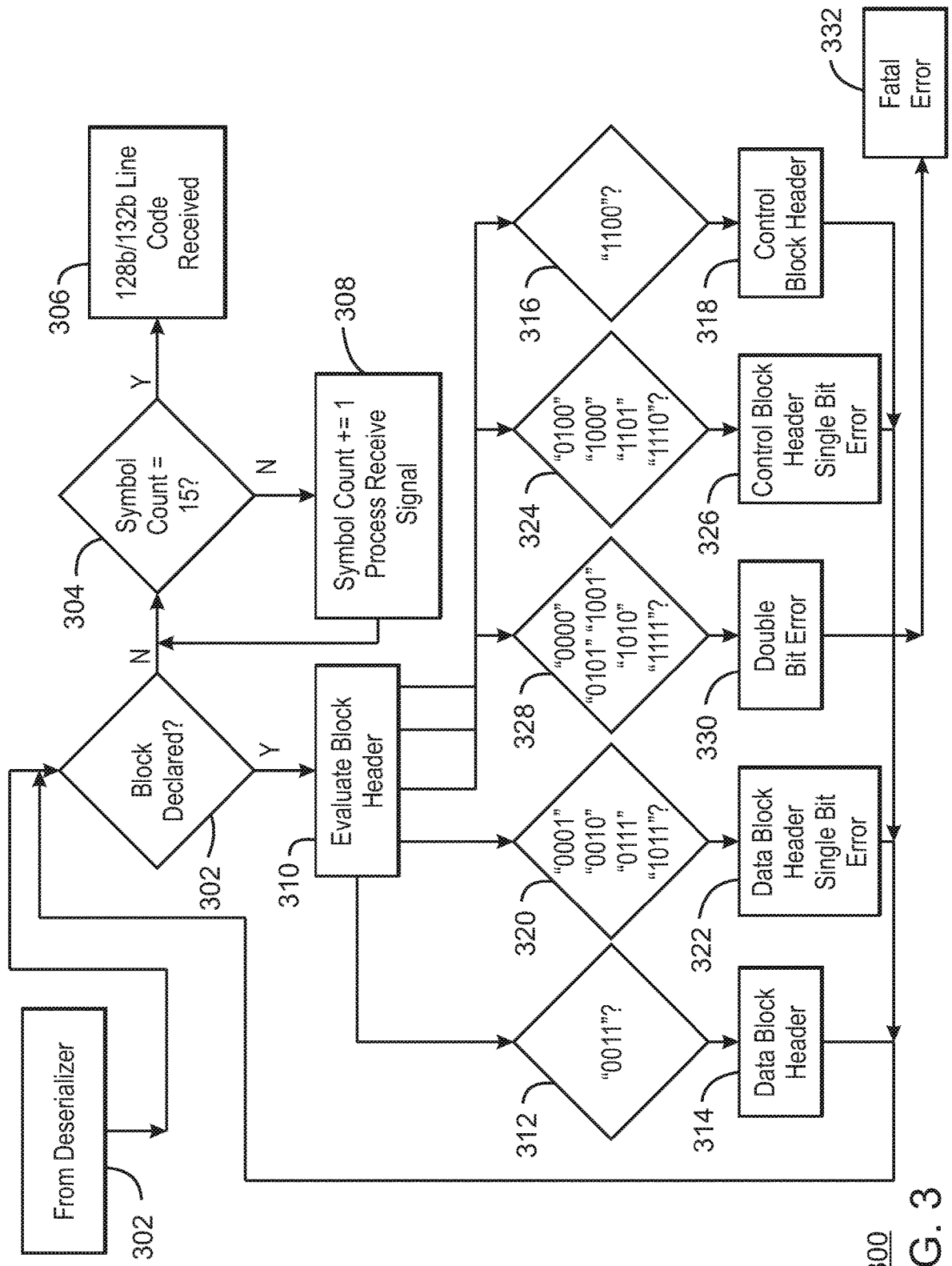
FIG. 3 is a process flow diagram illustrating a method of aligning a data payload associated with a 4-bit block header.

FIG. 3 is a process flow diagram illustrating a method of aligning a block payload associated with a 4-bit block header. The flow diagram 300 includes at least some operations of the decoder 210 of FIG. 2. At 302, the block payload converted from serial to parallel at by the deserializer 208 of FIG. 2 is received. The decoder 210 may determine whether a block header has been declared at 302. If a block header is not declared, the decoder 210 may proceed to block payload reception based on the symbol count 304. If the symbol count has reached 15, a block payload is received, as indicated at 306. If the symbol count has not reached 15, it may proceed to the next symbol reception and increment the symbol count accordingly as indicated at 308. Note that the specific number of bytes may depend on the line code definition. For example, in 128b/132b line code, the number of bytes of a block payload is 16. When starting from 0, the decoder 210 may determine whether the symbol count is 15, indicating 16 bytes in the incoming payload. If the symbol count is equal to 15, then aligner determines that a line coding, such as 128b/132b line code, has been received at block 306. If the symbol count is determined, at block 304, to be less than 15, then the aligner 210 may process the receive signal at block 308 and may cycle back to block 304 to determine whether the symbol count is equal to 15.

If, at block 302, a block header is declared, the decoder 210 may proceed to block 310 wherein the block header type may be evaluated. The evaluation at block 310 may identify the type of block headers and detect possible errors in the block header. For example, if the block header is "0011," as illustrated at block 312, the block header may be identified at block 314 as a data block header. If the block header is "1100," as illustrated at block 316, the block header may be identified at 318 as a control block header. Although in this example the data block header is set to "0011" and the control block header is set to "1100," other settings may be used. In embodiments, the setting of "0011" and "1100" as the data block and the control block, respectively, may enable a DC balance in the header, among other features.

Assuming that the data block header is set to "0011" and the control block header is set to "1100," as illustrated in FIG. 3, the aligner 210 may determine whether a header contains any single-bit errors or double bit errors. For example, if, at block 320, the block header is any one of the arrangements including "0001," "0010," "0111," or "1011," the decoder 210 may detect that that the data block header reveals a single-bit error at block 322. As another example, if, at block 324, the block header is any one of the arrangements including "0100," "1000," "1101," or "1110," the aligner 210 may detect that the control block header reveals a single-bit error at block 326. In some cases, the decoder 210 may read an arrangement, illustrated at block 328, having a double-bit error as indicated at block 330. Both the double-bit errors and the single-bit errors may be detectable and reported to a link layer. However, while the single-bit errors may be corrected by the aligner 210, a double-bit error may be a fatal error as indicated at block 332, and the link may enter a recovery process to re-establish the link.

Figure 4:
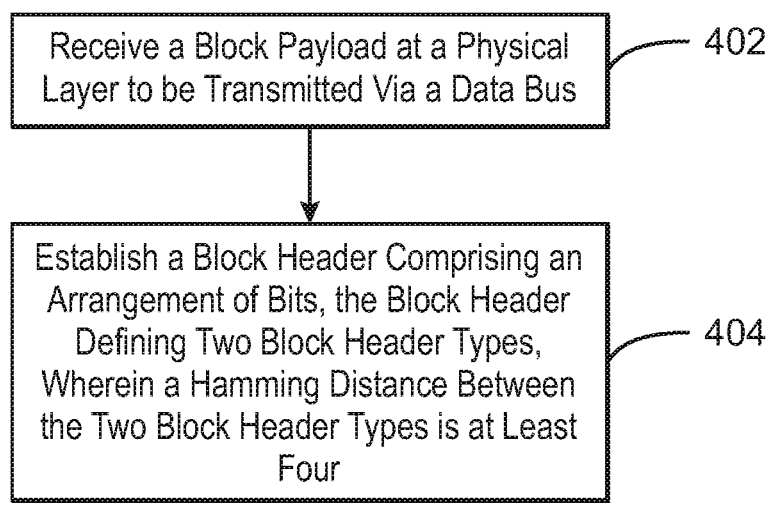
FIG. 4 is a block diagram illustrating a method for establishing a block header.

FIG. 4 is a block diagram illustrating a method for establishing a block header. At block 402, a block payload may be received at physical layer. The block payload may be configured to be transmitted via a data bus. At block 404, different block types may be defined by a block header. The block header defines at least two block header types. For example, the block header defines a control block header and a data block header. The definition of the block header types is such that a hamming distance between the header types is at least four.

Figure 5:
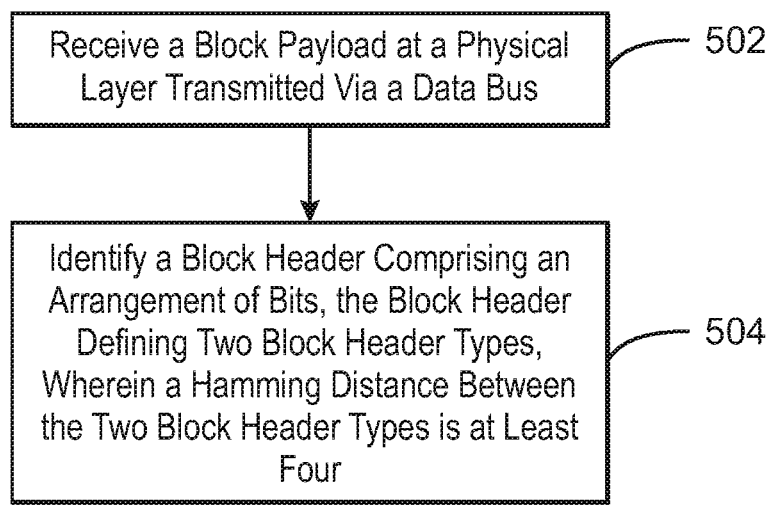
FIG. 5 is a block diagram illustrating a method for identifying a block header at a receiver.

FIG. 5 is a block diagram illustrating a method for identifying a block header at a receiver. The method 500 may receive, at block 502, a block payload at a physical layer transmitted via a data bus. A block header may be identified at block 504. The block header defines two block header types, such as a control block header and a data block header. The block header is defined such that a hamming distance between the two block header types is at least four.

Example 1

An electronic device is described herein. The electronic device may include an encoding means, such as an encoder, to establish a block header comprising an arrangement of bits, the block header defining at least two block header types, wherein a hamming distance between block header types is at least four. The electronic device may include a transmitting means, such as a transmitter, to transmit the block header followed by the block payload. An electronic device may include a receiving means, such as a receiver, to receive line encoded data; and a decoder to identify a block header comprising an arrangement of bits, the block header defining the content of a block payload, the block header defining two block header types, wherein a hamming distance between block header types is at least four.

Example 2

A method of encoding data is described herein. The method may include receiving a block payload at a physical layer to be transmitted via a data bus. The method may include establishing a block header comprising an arrangement of bits, the block header defining two block header types, wherein a hamming distance between block header types is at least four. Although the block header defines two header types, more than two header types may be defined.

Example 3

A tangible computer-readable medium comprising instructions to direct a processor to carry out operations is described herein. The operations may include receiving a block payload a physical layer transmitted via a data bus. The operations may include identifying a block header comprising an arrangement of bits, the block header defining two block header types, wherein a hamming distance between block header types is at least four. The block header may be identified at a receiving means, such as at a receiver. Although the block header defines two header types, more than two header types may be defined.

Some embodiments may be implemented in one or a combination of hardware, firmware, and software. Some embodiments may also be implemented as instructions stored on the tangible non-transitory machine-readable medium, which may be read and executed by a computing platform to perform the operations described. In addition, a machine-readable medium may include any mechanism for storing or transmitting information in a form readable by a machine, e.g., a computer. For example, a machine-readable medium may include read only memory (ROM); random access memory (RAM); magnetic disk storage media; optical storage media; flash memory devices; or electrical, optical, acoustical or other form of propagated signals, e.g., carrier waves, infrared signals, digital signals, or the interfaces that transmit and/or receive signals, among others.

An embodiment is an implementation or example. Reference in the specification to "an embodiment," "one embodiment," "some embodiments," "various embodiments," or "other embodiments" means that a particular feature, structure, or characteristic described in connection with the embodiments is included in at least some embodiments, but not necessarily all embodiments, of the present techniques. The various appearances of "an embodiment," "one embodiment," or "some embodiments" are not necessarily all referring to the same embodiments.

Not all components, features, structures, characteristics, etc. described and illustrated herein need be included in a particular embodiment or embodiments. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some embodiments have been described in reference to particular implementations, other implementations are possible according to some embodiments. Additionally, the arrangement and/or order of circuit elements or other features illustrated in the drawings and/or described herein need not be arranged in the particular way illustrated and described. Many other arrangements are possible according to some embodiments.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

It is to be understood that specifics in the aforementioned examples may be used anywhere in one or more embodiments. For instance, all optional features of the computing device described above may also be implemented with respect to either of the methods or the computer-readable medium described herein. Furthermore, although flow diagrams and/or state diagrams may have been used herein to describe embodiments, the techniques are not limited to those diagrams or to corresponding descriptions herein. For example, flow need not move through each illustrated box or state or in exactly the same order as illustrated and described herein.

The present techniques are not restricted to the particular details listed herein. Indeed, those skilled in the art having the benefit of this disclosure will appreciate that many other variations from the foregoing description and drawings may be made within the scope of the present techniques. Accordingly, it is the following claims including any amendments thereto that define the scope of the present techniques.

What is claimed is:

1. An electronic device interface, comprising:
   an encoder to establish a block header comprising an arrangement of bits, the block header defining two block header types, wherein a hamming distance between the two block header types is four; and
   a transmitter to transmit the block header followed by a block payload, wherein a bit rate clock is to enable correction of errors in the block header without re-transmission of the block header and the block payload.

2. The electronic device interface of claim 1, wherein the block header and block payload are transmitted as 128b/132b line encoded data.

3. The electronic device interface of claim 1, wherein a scrambler is bypassed for the bits of the block header.

4. The electronic device interface of claim 1, wherein the block payload comprises 128 bits and the block header comprises four bits.

5. The electronic device interface of claim 1, wherein a first block header type is a data block header type and a second block header type is a control block header type.

6. The electronic device interface of claim 5, wherein the data block header type indicates a data block payload is to follow and the control block header type indicates that a control message payload is to follow.

7. The electronic device interface of claim 1, wherein a bit rate clock is embedded in a data stream that comprises the block header and the block payload.

8. The electronic device interface of claim 1, wherein in response to a configuration of a single bit, a scrambler is to be bypassed.

9. A method of decoding data, comprising:
   receiving 128b/132b line encoded data comprising a four-bit block header followed by a 128 bit block payload;
   identifying a block header comprising an arrangement of bits, the block header defining content of a block payload using two block header types comprising a data block header type and a control block header type; and
   wherein a hamming distance between the two block header types is four.

10. The method of claim 9, wherein the data block header type indicates a data block payload is to follow and the control block header type indicates that a control message payload is to follow.

11. The method of claim 9, comprising correcting a single bit error.

12. The method of claim 9, comprising detecting a two bit error.

13. The method of claim 9, wherein the four bit block header is not scrambled.

14. The method of claim 9, comprising descrambling the block payload based in part on a reference clock.

15. The method of claim 9, comprising deriving a recovered symbol clock from a bit rate clock embedded in the line encoded data.

16. The method of claim 9, wherein the block payload is transmitted at a DisplayPort (DP) interface.

17. A method of encoding data, comprising:
   establishing a block header comprising an arrangement of four bits that enables detection and correction of single bit errors within the block header, the block header defining two block header types; and
   transmitting the block header followed by a block payload comprising 128 bits of block data, wherein a hamming distance between the two block header types is to enable correction of single bit errors in the block header without re-transmission of the block header and the block payload.

18. The method of claim 17, comprising embedding a bit rate clock in a data stream that comprises the block header and the block payload.

19. The method of claim 17, comprising bypassing scrambling of the bits of the block header.

20. The method of claim 17, comprising scrambling of the bits of the block payload.

21. The method of claim 17, wherein the block header and the block payload are transmitted at a DisplayPort (DP) interface.

* * * * *